United States Patent
Uchikawa et al.

(10) Patent No.: US 8,136,014 B2
(45) Date of Patent: Mar. 13, 2012

(54) NON-VOLATILE SEMICONDUCTOR MEMORY DEVICE

(75) Inventors: Hironori Uchikawa, Yokohama (JP);
Tatsuyuki Ishikawa, Yokohama (JP);
Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1020 days.

(21) Appl. No.: 11/860,015

(22) Filed: Sep. 24, 2007

(65) Prior Publication Data

US 2008/0301532 A1     Dec. 4, 2008

(30) Foreign Application Priority Data

Sep. 25, 2006  (JP) .................................. 2006-259080

(51) Int. Cl.
*G11C 29/00* (2006.01)
(52) U.S. Cl. ............... 714/763; 365/185.33; 365/185.09
(58) Field of Classification Search .................. 714/763; 365/185.33, 185.09
See application file for complete search history.

(56) References Cited

U.S. PATENT DOCUMENTS

| | | | | |
|---|---|---|---|---|
| 5,459,742 A | * | 10/1995 | Cassidy et al. ................. | 714/769 |
| 5,734,787 A | * | 3/1998 | Yonemitsu et al. ............ | 386/297 |
| 6,883,817 B2 | * | 4/2005 | Chu ............................... | 280/278 |
| 7,096,406 B2 | * | 8/2006 | Kanazawa et al. ............ | 714/763 |
| 7,296,128 B2 | * | 11/2007 | Lee ................................ | 711/165 |
| 7,325,155 B2 | * | 1/2008 | Trantham et al. ............. | 714/6.24 |
| 7,346,825 B2 | * | 3/2008 | Rankin et al. ................. | 714/752 |
| 7,530,005 B2 | * | 5/2009 | Satori et al. ................... | 714/763 |
| 7,644,216 B2 | * | 1/2010 | Fahr et al. ..................... | 710/301 |
| 7,872,895 B2 | * | 1/2011 | Miura et al. ................... | 365/63 |

FOREIGN PATENT DOCUMENTS

| | | |
|---|---|---|
| JP | 10-222989 | 8/1998 |
| JP | 11-232176 | 8/1999 |
| JP | 11-250695 | 9/1999 |
| JP | 11-317095 | 11/1999 |
| JP | 2000-149592 | 5/2000 |
| JP | 2003-036693 | 2/2003 |
| JP | 2005-078721 | 3/2005 |
| JP | 4162672 | 8/2008 |
| JP | 4212594 | 11/2008 |

OTHER PUBLICATIONS

U.S. Appl. No. 11/877,287, filed Oct. 23, 2007, Uchikawa, et al.
U.S. Appl. No. 12/060,630, filed Apr. 1, 2008, Tanaka.
Office Action issued Oct. 25, 2011, in Japanese Patent Application No. 2006-259080, (with English-language Translation).

* cited by examiner

*Primary Examiner* — Esaw Abraham
(74) *Attorney, Agent, or Firm* — Oblon, Spivak, McClelland, Maier & Neustadt, L.L.P.

(57) ABSTRACT

A non-volatile semiconductor memory device comprises a memory cell array including a plurality of memory cells arrayed capable of storing information of N bits (N≧2) in accordance with variations in threshold voltage. A parity data adder circuit adds parity data for error correction to every certain data bits to be stored in the memory cell array. A frame converter circuit uniformly divides frame data containing the data bits and the parity data into N pieces of subframe data. A programming circuit stores the subframe data divided into N pieces in respective N sub-pages formed corresponding to the information of N bits.

10 Claims, 11 Drawing Sheets

SUB PAGE1

SUB PAGE2

SUB PAGE3

ECC Page DATA

ECC Page DATA

US 8,136,014 B2

NON-VOLATILE SEMICONDUCTOR MEMORY DEVICE

CROSS-REFERENCE TO RELATED APPLICATION

This application is based upon and claims the benefit of priority from prior Japanese Patent Application No. 2006-259080, filed on Sep. 25, 2006, the entire contents of which are incorporated herein by reference.

BACKGROUND OF THE INVENTION

1. Field of the Invention

The present invention relates to a non-volatile semiconductor memory device, and more particularly to a non-volatile semiconductor memory device capable of storing multiple bits in one memory cell.

2. Description of the Related Art

Known non-volatile semiconductor memory devices include an NAND cell-type flash memory. The NAND cell-type flash memory comprises a memory cell array including a plurality of NAND cell units. An NAND cell unit includes a plurality of memory cells serially connected, and two selection transistors connected to both ends thereof. A memory cell in an erased state holds "1"-data with a negative threshold voltage. At the time of data write, electrons are injected into a floating gate, thereby rewriting the cell to hold "0"-data with a positive threshold voltage. The NAND cell-type flash memory is capable of shifting the threshold voltage only from a lower one to a higher one at the time of data write. The reverse shift (from a higher threshold voltage to a lower one) can be executed only in an erase operation on a block basis.

For the purpose of increasing the memory capacity in recent years, there has been developed the so-called multi-level NAND cell-type flash memory that can store information of two or more bits in one memory cell. If multi-level storage is executed in one memory cell provided with a plurality of threshold voltages, however, the more the value of multi-level storage is increased, the narrower the interval between adjacent threshold voltages becomes, resulting in an increased probability of erroneously reading out the stored information.

JP Patent No. 3165101 therefore discloses an invention in which multi-level data of multiple bits is divided into an upper bit group and a lower bit group such that error correction can be executed to each group. This is effective to execute error correction even if one memory cell is broken.

JP 2005-78721A on the other hand discloses an invention in which multi-level data of multiple bits is divided into an upper bit group and a lower bit group such that error correction can be executed to each group through different schemes. This invention focuses on a difference in the error probabilities between the upper bit group and the lower bit group contained in the multi-level data.

SUMMARY OF THE INVENTION

In one aspect the present invention provides a non-volatile semiconductor memory device, comprising: a memory cell array including a plurality of memory cells arrayed capable of storing information of N bits (N≧2) in accordance with variations in threshold voltage; a parity data adder circuit configured to add parity data for error correction to every certain data bits to be stored in the memory cell array; a frame converter circuit configured to uniformly divide frame data containing the data bits and the parity data into N pieces of subframe data; and a programming circuit configured to store the subframe data divided into N pieces in respective N subpages formed corresponding to the information of N bits.

DETAILED DESCRIPTION OF THE EMBODIMENTS

Multi-Level Storage in Present Embodiment

Multi-level storage in an embodiment of the present invention is described. The multi-level storage in the embodiment of the present invention is executed in an NAND cell-type flash memory by providing multiple values of the threshold voltage in one memory cell.

For example, on storage of information of two bits in one memory cell, four types of voltage states are provided as threshold voltages. The four types of such values correspond to "11", "10", "01", "00" of the information of two bits and are used in data write and read.

Figure 1:
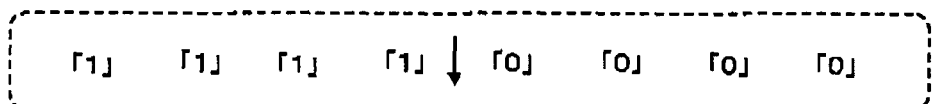
FIG. 1 is an illustrative view of multi-level storage in an NAND cell-type flash memory.
Figure 1:
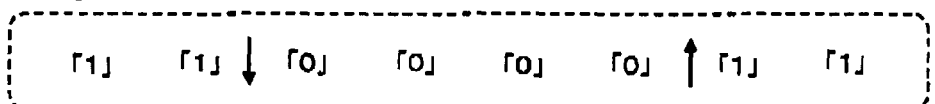
Figure 1:
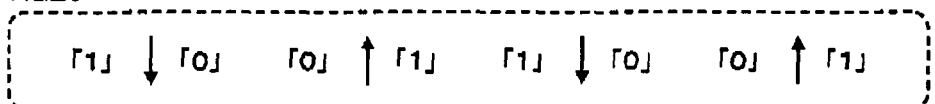
Figure 1:
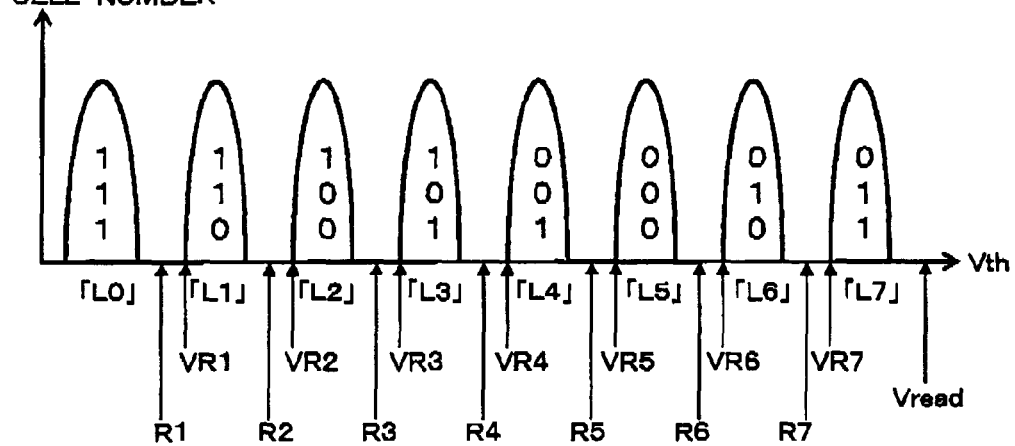

FIG. 1 shows a state diagram of a voltage distribution on storage of information of three bits in one memory cell (a relationship diagram between the threshold voltage Vth and the number of cells). For storage of information of three bits, eight types of threshold voltages are provided corresponding to pieces of information in states "111", "110", "101", "100", "011", "010", "001". The threshold voltages correspond to the information of three bits and are used in data write and read. Namely, variations in threshold voltage form eight levels "L0", "L1", "L2", "L3", "L4", "L5", "L6", "L7" as multi-level levels. In response to these levels, voltage values of the voltage (multi-bit read voltage) applied to a selected word line at the time of information read are denoted with R1, R2, R3, R4, R4, R5, R6, R7. In contrast, voltage values at the time of verify for identifying completion of data write are denoted with VR1, VR2, VR3, VR4, VR4, VR5, VR6, VR7.

As shown in FIG. 1, the higher the value of multi-level storage (the amount of information stored in one memory cell, that is, the number of bits) becomes, the narrower the interval between threshold voltages becomes. In multi-level storage, data write and read can be executed based on the threshold voltage. Therefore, the narrowed interval between threshold voltages may easily cause a failure in data write and read.

In the present embodiment, multi-level storage of three bits is executed in one memory cell, and three sub-pages are formed corresponding to respective bits in the multi-level memory cell. Namely, the sub-page 1, the sub-page 2, and the sub-page 3 are formed.

In normal binary ascending/descending in multiple bits, the number of bit inversions from "1" to "0" or from "0" to "1" (variations in bit) gradually increases at a lower bit (lower binary digit) and every ascent/descent inverts the bit at the lowest bit. FIG. 1 illustrates an arrangement in which the number of inversions are decreased as low as possible.

In the case shown in FIG. 1, the multi-level data may be varied from the minimum to the maximum in one memory cell. In this case, the number of bit inversions (variations in bit) in the sub-page 1 is equal to one, the number of bit inversions in the sub-page 2 is equal to two, and the number of bit inversions in the sub-page 4 is equal to four. The number of bit inversions in the sub-page has extremely strong correlation with the probability of error. Therefore, the probability of error and the rate of restoration by error correction may vary from sub-page to sub-page.

Therefore, the method of evening the rates of restoration by error correction using the error correction scheme that varies from sub-page to sub-page as disclosed in JP 2005-78721A is not practical because it results in a complicated configuration.

First Embodiment

An embodiment in the present invention is described below.

Figure 2:
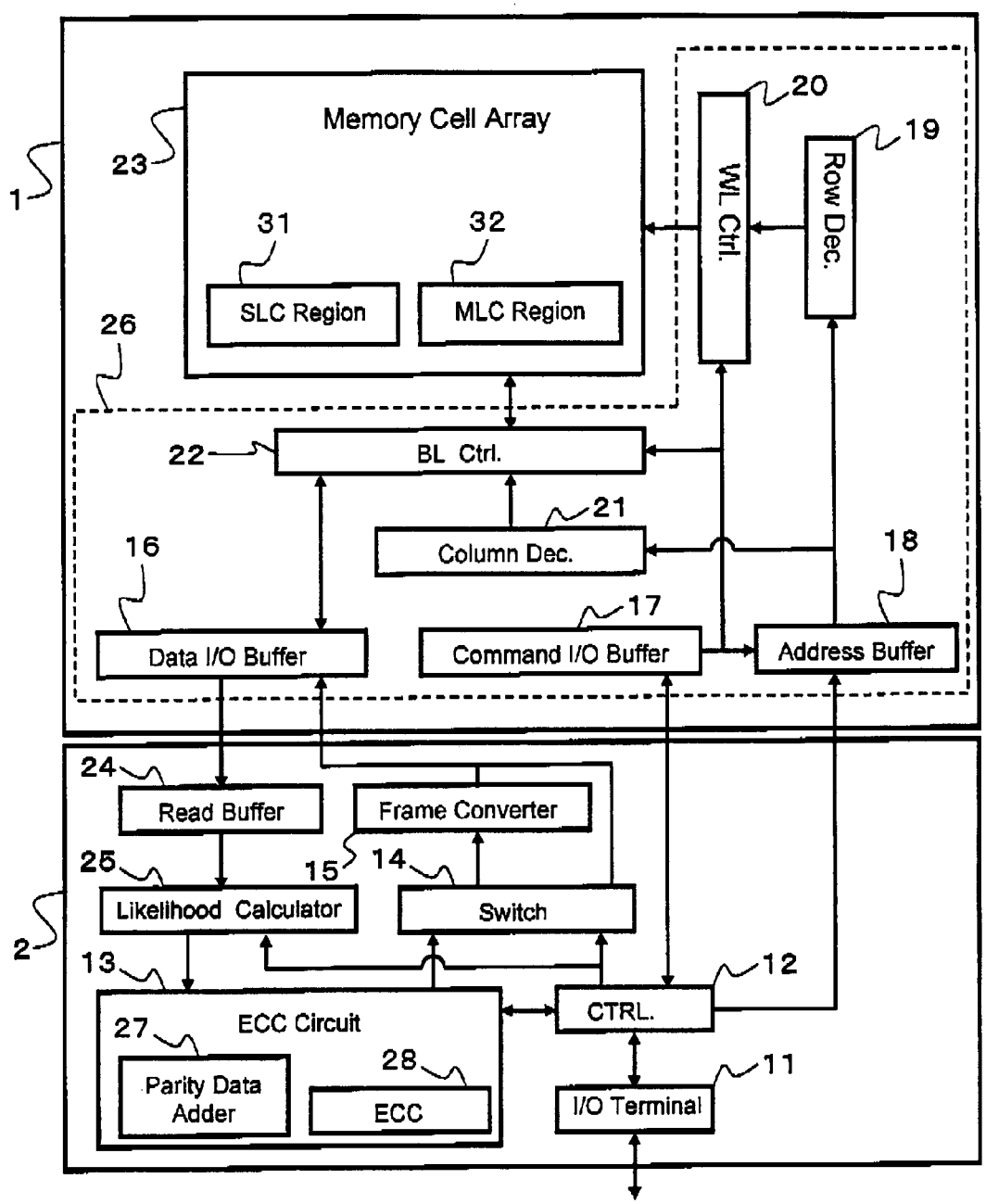
FIG. 2 is a block diagram of a non-volatile semiconductor memory device in a first embodiment.

FIG. 2 is a block diagram of a 3-bit multi-level storage NAND cell-type flash memory, which is a non-volatile semiconductor memory device in the present embodiment.

The 3-bit multi-level storage NAND cell-type flash memory in the present embodiment comprises a memory section 1, and a control section 2 for controlling the memory section 1.

The memory section 1 includes a data I/O buffer 16, a command I/O buffer 17, an address buffer 18, a row decoder 19, a word line controller 20, a column decoder 21, a bit line controller 22, and a memory cell array 23. A programming circuit 26 includes the data I/O buffer 16, the command I/O buffer 17, the address buffer 18, the row decoder 19, the word line controller 20, the column decoder 21, and the bit line controller 22.

The memory cell array 23 includes memory cells arrayed in matrix for data storage. Namely, the memory cell array 23 includes a plurality of word lines, a plurality of bit lines and a common source line, and electrically erasable programmable memory cells are arrayed at intersections of the word lines and the bit lines. A memory cell is used to store frame data, which includes input data and parity data (redundant data) for error correction added to the input data at every certain data bits.

The memory cell array 23 is connected to the word line controller 20 configured to control the word line voltage, and to the bit line controller 22. The word line controller 20 selects a word line in accordance with an address signal decoded at the row decoder 19 and controls the word line voltage. The row decoder 19 receive signals from the control section 12 via the address buffer 18.

The bit line controller 22 is a sense amp and data latch circuit, which has a function of sensing/amplifying a signal based on data from a memory cell in the memory cell array 23 as well as a data latch function of holding read data or write data.

The bit line controller 22 is connected to the column decoder 21, the data I/O buffer 16 and the command I/O buffer 17. The bit line controller 22 has a function of selecting a bit line in accordance with an address signal decoded at the column decoder 21.

The data I/O buffer 16 has a function of temporarily holding I/O data to/from the bit line controller 22 to provide data to the control section 2 via the data I/O buffer 16. The data I/O buffer 16 also has a function of temporarily holding data to be written in the memory cell array 23 or data read out of the memory cell array 23.

The command I/O buffer 17 has a function of temporarily holding a command transferred from the control circuit 12 in the control section 2 to the memory section 1. The address buffer 18 has a function of temporarily holding the address signal from the control circuit 12 in the control section 2.

The control section 2 includes an I/O terminal 11, a control circuit 12, an ECC circuit 13, a switch 14, a frame converter 15, a read buffer 24, and a likelihood value calculator 25.

The I/O terminal 11 is used to input/output a data sequence from/to external therethrough. The control circuit 12 is used to control data write and read based on the data sequence input from the I/O terminal 11.

The ECC circuit 13 includes a parity data adder 27 and an error correction circuit 28. The parity data adder 27 is a circuit having a function of adding parity data to every certain data bits at the time of data write. The error correction circuit 28 is configured to conduct an error correction for data read out.

The switch 14 has a function of selecting the frame converter 15 or not in accordance with the write condition.

The frame converter 15 has a function of converting input data, at the time of writing data into a multi-level memory region (MLC region) 32, into data to be stored in the MLC region 32.

In the present embodiment, the input data from the input terminal 11 is additionally given parity data via the control circuit 12 from the parity data adder 27 in the ECC circuit 13. Such the parity data-added frame data or ECC frame is divided into multiple pieces of subframe data or ECC subframes to be stored in the multi-level memory region 32.

Figure 3:
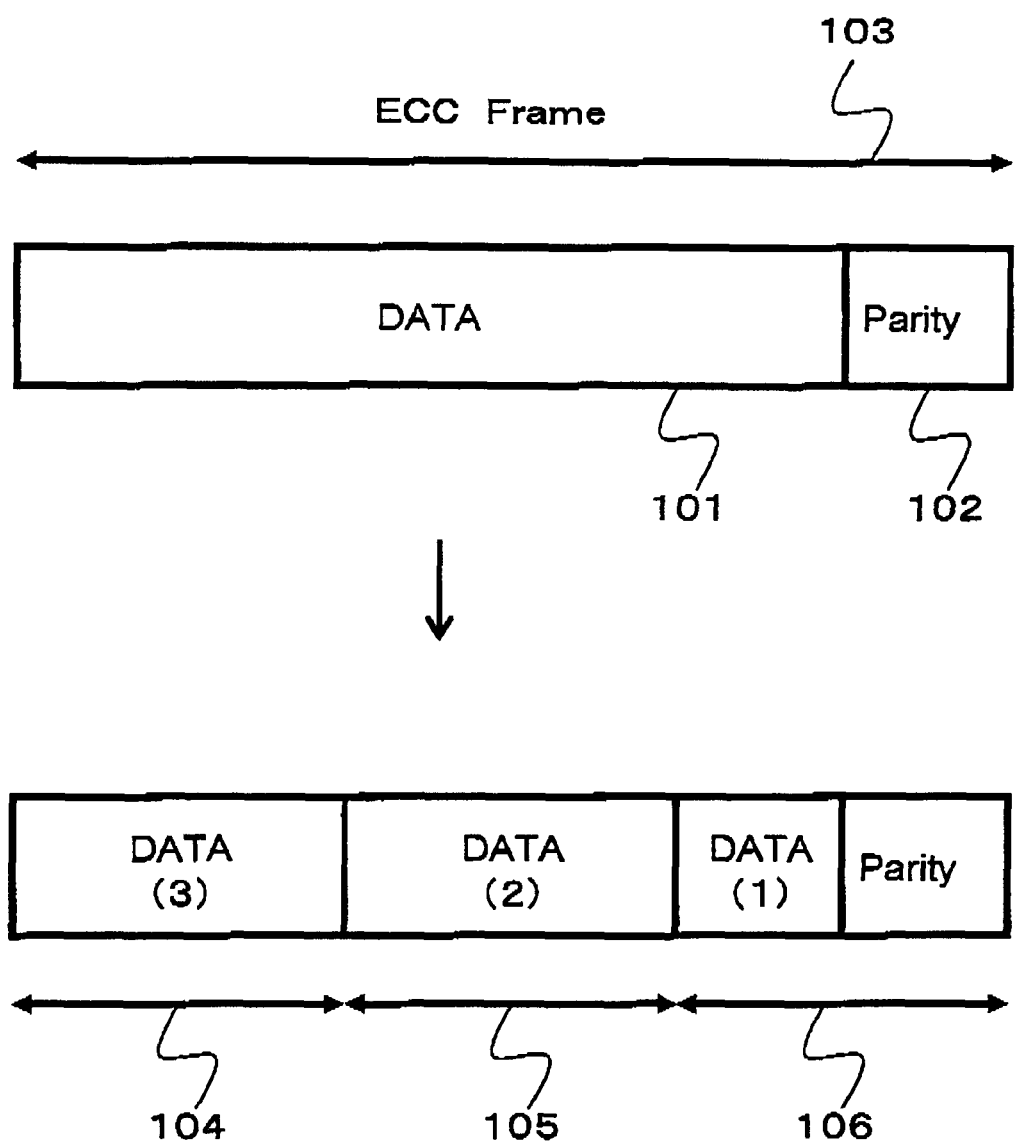
FIG. 3 is an illustrative view of frame conversion in the first embodiment.

Specifically, as shown in FIG. 3, the parity data adder 27 adds the parity data 102 to the original data or data bits 101 to form the ECC frame 103.

The frame converter 15 divides the ECC frame 103 into three to form an ECC subframe 104, an ECC subframe 105, and an ECC subframe 106.

The read buffer 24 has a function of temporarily holding data output from the memory section 1 via the data I/O buffer 16.

The likelihood value calculator 25 has a function of calculating likelihood values corresponding to the bits stored in the multi-level memory cell based on the data temporarily held in the read buffer 24. The likelihood value is a value representative of the likelihood of information in a bit. The likelihood value calculator 25 calculates the likelihood of information in a bit, that is, the probability of "1" or the probability of "0" stored in a bit.

In the present embodiment, the algorithm used at the error correction circuit 28 in the ECC circuit 13 is an error-correcting scheme that executes soft-decision decoding such as a LDPC (Low Density Parity Check) code or the like. Alternatively, another error-correcting scheme may also be used, which executes hard-decision decoding such as a Reed-Solomon code or the like.

In the memory cell array 23, all of the memory cells may be multi-level memory cells. In the present embodiment, though, it comprises a multi-level memory region 32 including a plurality of memory cells arrayed capable of storing multi-level information, and a binary memory region 31 including a plurality of memory cells arrayed capable of storing one-bit information. The multi-level memory region 32 can store multiple pieces of page data at one physical address. In the present embodiment, it is also referred to as a MIC (Multi Level Cell) region. The binary memory region 31 can store a single piece of page data at one physical address. In the present embodiment, it is also referred to as a SLC (Single Level Cell) region.

In the present embodiment, the MLC region (multi-level memory region) 32 includes eight-level cells each capable of storing information of three bits, which can store three pages of data at one physical address. The present invention is not limited to eight values but rather can be applied to multi-level storage corresponding to a power of two.

Figure 4:
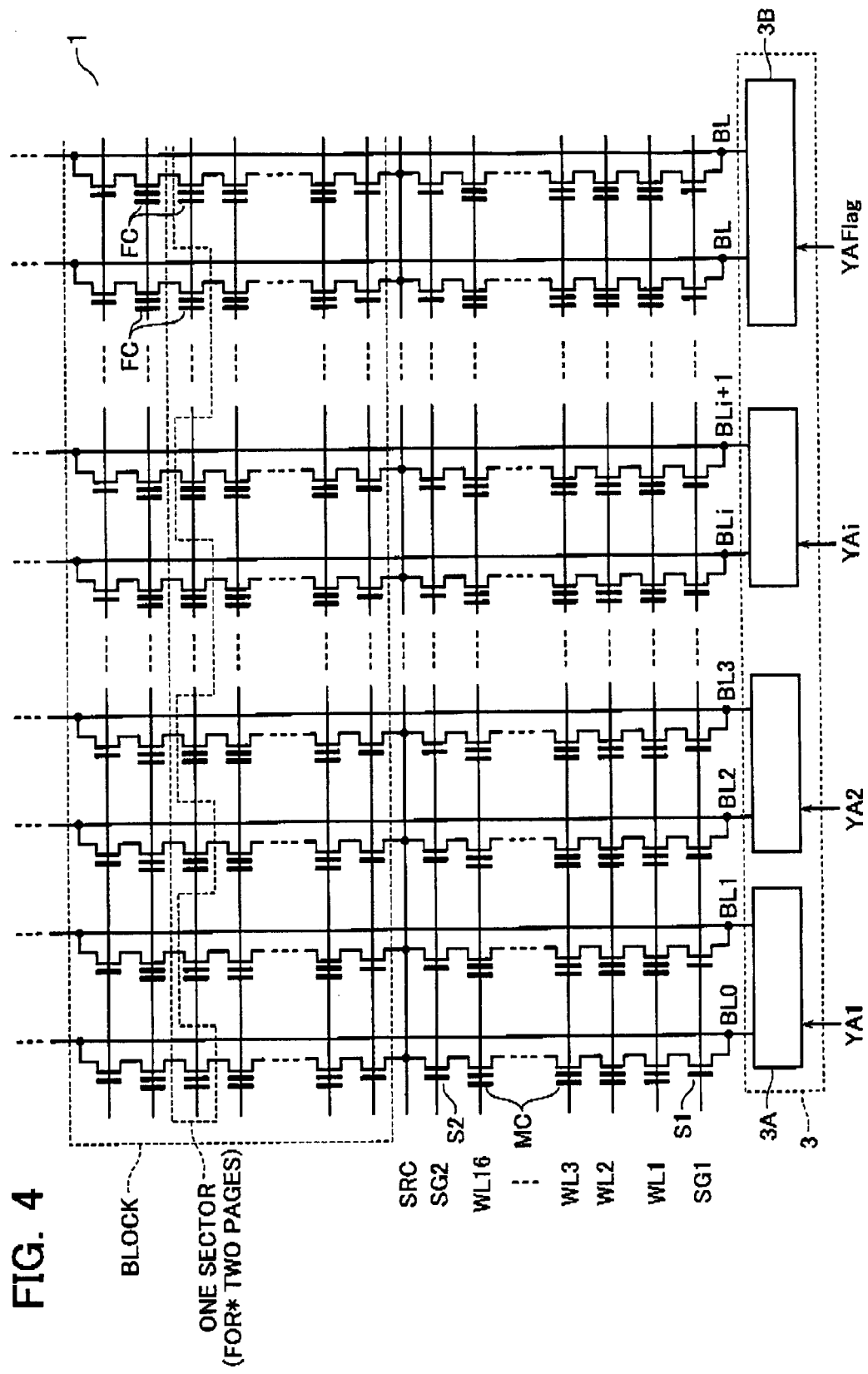
FIG. 4 is a circuit diagram of a memory cell array 23 and a bit line controller 22 shown in FIG. 2.

FIG. 4 shows a structure of the memory cell array 23 shown in FIG. 2, and the bit line controller 22 in detail.

The memory cell array 23 comprises a NAND cell-type memory cell array. The NAND cell type memory cell array includes a plurality of NAND cells. As shown in FIG. 4, One NAND cell includes memory cells MC comprising, for example, 16 EEPROMs connected in series and selection gates S1 and S2 connected to both ends thereof.

The selection gate S1 is connected to a bit-line BL0. The selection gate S2 is connected to a source line SRC.

The memory cell MCs arranged on the same row have control gates that are commonly connected to word-lines WL1, WL2, and WL3 to WL16. The first selection gates S1 is commonly connected to a select line SG1. The second selection gates 52 is commonly connected to a select line SG2.

The memory cell array 1 includes, as shown by a broken line, a plurality of blocks. Each block includes a plurality of NAND cells. Data is erased per a block. The erase operation is performed at the same time on two bit-lines connected to a data storage circuit 22A or a flag data storage circuit 22B.

The sense amplifier circuit 3 includes a plurality of the data storage circuits 22A and the flag data storage circuit 22B. Connected to the data storage circuits 22A and the flag data storage circuit 22B are respective pairs of bit-lines (BL0 and BL1), (BL2 and BL3) . . . (BLi and BLi+1), and (BL and BL).

Each data storage circuit 22A has a function of holding data read from the memory cell MC. The data storage circuit 22A also has a function of holding data to be written to the memory cell MC. The storage circuit 22A also serves to operate internal data when plural-bit data write and plural-bit data read is performed, as described below, and when soft-value data is generated, as described below.

A plurality of memory cells (enclosed by a broken line) form one sector. The memory cells in one sector are arranged on every other bit-line and are connected to one word-line. A set of data is written to and read from each sector. One sector stores, for example, three-page data. Connected to each word-line is a flag cell FC to store the flag data FLAG. The flag cell FC stores the flag data FLAG. T In a read operation, a program verify operation, and a program operation, one bit-line is selected from among the two bit-lines (BLi and BLi+1) connected to the data storage circuit 22A according to the address signal (YA1, YA2, . . . , YAi, and YAflag) specified from the outside. Also, according to the external address, one word-line is selected and one sector (for three pages) is selected. Switching between the three pages is performed according to the address.

Figure 5:
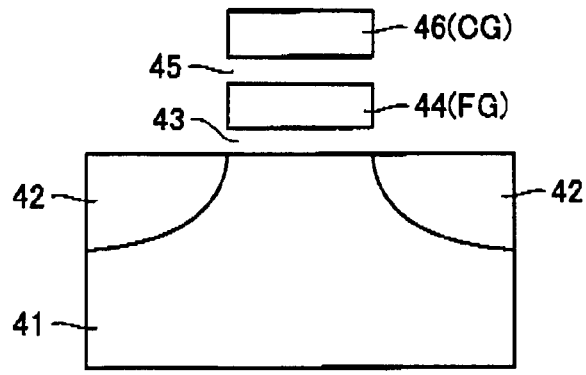
FIG. 5 is a cross-sectional view of a memory cell MC in FIG. 4.
Figure 6:
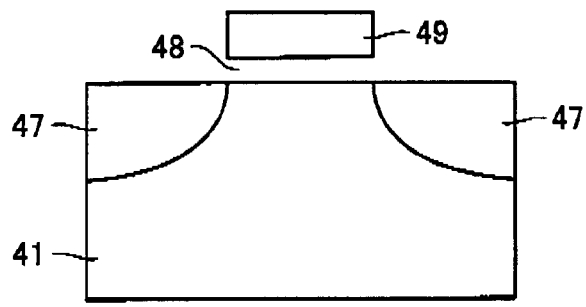
FIG. 6 is a cross-sectional view of selection gates S1, S2 in FIG. 4.

FIGS. 5 and 6 show cross-sectional structures of the memory cell MC and the selection gates S1 and S2. FIG. 6 shows a cross-sectional structure of the memory cell MC. The substrate 41 has n-type diffusion layers 42 formed therein. The diffusion layers 42 function as a source and a drain of MOSFET included in the memory cell MC, respectively. The substrate 41 also has a floating gate (FG) 44 formed thereon via a gate-insulating layer 43. The floating gate 44 has a control gate (CG) 46 formed thereon via the insulating layer 45.

The selection gates S1 and S2 each include a substrate 41 and n-type diffusion layers 47 formed in the substrate 41. The diffusion layers 47 serve as a source and a drain, respectively. The substrate 41 has a control gate 49 formed thereon via a gate-insulating layer 48.

Figure 7:
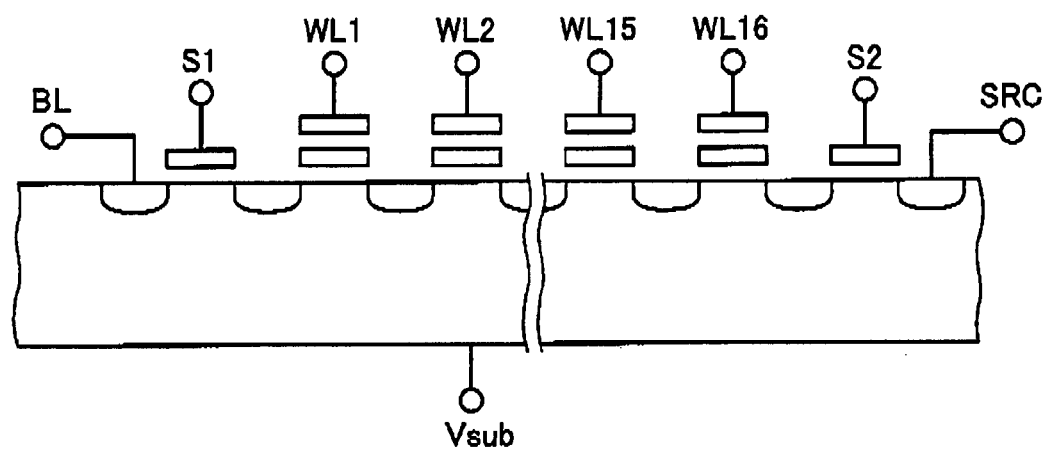
FIG. 7 is a cross-sectional view showing one NAND cell in the memory cell array.

FIG. 7 shows a cross section of one NAND cell in the memory cell array. In this example, the one NAND cell includes 16 memory cells MC connected in series, each having a configuration in FIG. 5. The NAND cell includes, on its drain side and source side, the first selection gates S1 and S2 each having a configuration in FIG. 6.

Figure 8:
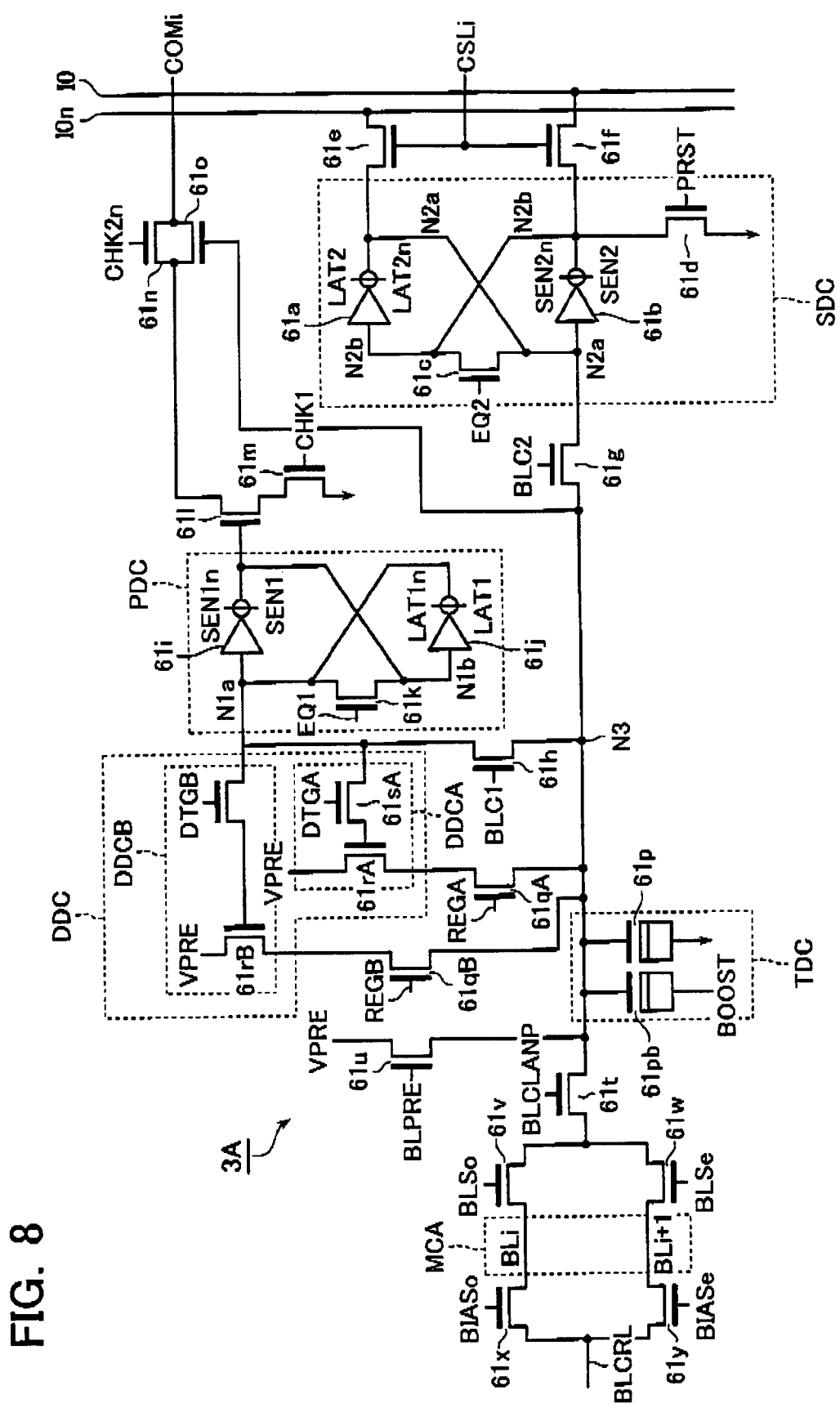
FIG. 8 is a circuit diagram showing a configuration example of a data storage circuit 22A shown in FIG. 5.

An example configuration of the data storage circuit 22A is described below with reference to FIG. 8. Note that the data storage circuit 22B has a similar configuration to the circuit 22A, so its description is omitted here. The data storage circuit 22A includes a primary data cache (PDC), a secondary data cache (SDC), a dynamic data cache (DDC), and a temporary data cache (TDC).

The SDC, PDC, and DDC hold input data in a write operation, hold read data in a read operation, temporarily hold data in a verify operation, and are responsible for data storage to operate internal data in multi-level data storage. The TDC amplifies bit-line data and temporarily holds the data in a data read operation. The TDC is also used to operate internal data in multi-level data storage.

The SDC includes clocked inverter circuits 61a and 61b and transistors 61c and 61d. The inverter circuits 61a and 61b make up a latch circuit. The transistor 61c is connected between the input terminals of the clocked inverter circuits 61a and 61b. The transistor 61c receives at its gate a signal EQ2.

The transistor 61d is connected between the output terminal of the clocked inverter circuit 61b and the ground. The transistor 61d receives at its gate a signal PRST.

The SDC has a node N2a (the output terminal of the clocked inverter circuit 61a). The node N2a is connected, via a column selection transistor 61e, to an input-output data line IOn. The SDC also has a node N2b (the output terminal of the clocked inverter circuit 61b). The node N2b is connected, via a column selection transistor 61f, to an input-output data line IO. The column selection transistors 61e and 61f receive at their gates a column selection signal CSLi.

The PDC includes clocked inverter circuits 61i and 61j and a transistor 61k. The inverter circuits 61i and 61j make up a latch circuit. The transistor 61k is connected between the input terminals of the clocked inverter circuits 61i and 61j. The transistor 61k receives at its gate a signal EQ1. A node N1a of the PDC and the node N2a of the SDC are connected via transistors 61g and 61h. The transistor 61g receives at its gate a signal BLC2. The transistor 61h receives at its gate a signal BLC1.

The PDC also has a node N1$b$ (the input terminal of the clocked inverter circuit 61$j$). The node N1$b$ is connected to the gate of a transistor 61$l$. The current path of the transistor 61$l$ has one end grounded via a transistor 61$m$. The transistor 61$m$ receives at its gate a signal CHK1. The current path of the transistor 61$l$ has the other end connected to one ends of the current paths of transistors 61$n$ and 61$o$ both making up a transfer gate. The transistor 61$n$ receives at its gate a signal CHK2$n$. The gate of the transistor 61$o$ is connected to a connection node between the transistors 61$g$ and 61$h$.

The current paths of the transistors 61$n$ and 61$o$ have the other ends supplied with a signal COMi. The signal COMi is a signal common to all data storage circuits 22A. The signal COMi indicates whether verification of all data storage circuits 22A is complete. After the verification is complete, the node N1$b$ of the PDC changes to "L," as described below. In this condition, changing the signals CHK1 and CHK2$n$ to "H," causes the signal COMi to become "H", if the verification is complete.

The TDC includes, for example, a MOS capacitor 61$p$. The MOS capacitor 61$p$ is connected between the ground and a connection node N3 between the transistors 61$g$ and 61$h$. Connected to the connection node N3, via a transistor 61$q$, is the DDC. The transistor 61$q$ receives at its gate a signal REG.

The DDC includes transistors 61$r$ and 61$s$. The current path of the transistor 61$r$ has one end supplied with a signal VREG. The current path has the other end connected to the current path of the transistor 61$q$. The gate of the transistor 61$r$ is connected via the transistor 61$s$ to the node N1$a$ of PDC. The transistor 61$s$ receives at its gate a signal DTG.

Also connected to the connection node N3 are one ends of the current paths of transistors 61$t$ and 61$u$. The current path of the transistor 61$u$ has the other end supplied with a signal VPRE. The transistor 61$u$ receives at its gate a signal BLPRE.

The transistor 61$t$ receives at its gate a signal BLCLAMP. The current path of the transistor 61$t$ has the other end connected via a transistor 61$v$ to a bit-line BLi. The other end is also connected via a transistor 61$w$ to a bit-line BLi+1.

The bit-line BLi has the other end connected to one end of the current path of a transistor 61$x$. The transistor 61$x$ receives at its gate a signal BlASo. The bit-line BLi+1 has the other end connected to one end of the current path of a transistor 61$y$. The transistor 61$y$ receives at its gate a signal BlASe. The current paths of the transistors 61$x$ and 61$y$ have the other ends supplied with a signal BLCRL. The transistor 61$x$ and 61$y$ turn on, according to the signals BlASo and BlASe, in a complementary manner with the transistors 61$v$ and 61$w$. The transistor 61$x$ and 61$y$ supply the unselected bit-line with the potential of the signal BLCRL.

[Method of Writing]

The following description is given to a method of writing data in the non-volatile semiconductor memory device of the present embodiment. There are two write modes: data write to the MLC region 32 (MLC write); and data write to the SLC region 31 (SLC write).

The write procedure in the present embodiment is described briefly. The data input from external via the I/O terminal 11 is initially written into the SLC region 31. When the SLC region 31 accumulates sufficient data to be written in the MLC region 32, that is, in this embodiment, three pages or more of data corresponding to one page in the MLC region 32, the data is read out of the SLC region 31 and written into multi-level memory cells in the MLC region 32. This MLC write is activated in response to the control instruction from external and executed at every three sub-pages.

The writing method is described in detail with reference to FIG. 2. At the time of the SLC-write, the I/O terminal 11 receives a data sequence from external and transfers it to the control circuit 12. The data sequence includes an instruction to the control circuit 12, a write address, and one page of bit data to be written. The control circuit 12 generates a write command, a write address, and write data based on the data sequence and transfers them to the command I/O buffer 17, the address buffer 18, and the ECC circuit 13, respectively. The write data is additionally given parity data for error correction, which is generated corresponding to every certain data bits at the parity data adder 27 in the ECC circuit 13. The certain data bits and the given parity data for error correction form frame data (ECC frame). Thereafter, the frame data is transferred via the switch 14 to the data I/O buffer 16 and the data is written via the bit line controller 22 into a memory cell corresponding to the write address in the SLC region 31 in the memory cell array 23.

The write command transferred to the command I/O buffer 17 is further transferred to the word line controller 20 and the bit line controller 22. The write address transferred to the address buffer 18 is transferred to the word line controller 20 via the row decoder 19 and to the bit line controller 22 via the column decoder 21. Thus, a control can be executed to write data into a memory cell in the SLC region 31 in the memory cell array 23.

The MLC write is described next. The I/O terminal 11 receives a MLC write instruction from external and transfers it to the control circuit 12. The MLC write instruction includes an address in the SLC region 31 from which data is read out for writing data in the MLC region 32, and an address in the MLC region 32 in which data is written. The MLC write instruction transferred to the control circuit 12 is further transferred via the command I/O buffer 17 and the bit line controller 22 to the memory cell array 23. In the memory cell array 23, in response to the received MLC write instruction, three pages of data are read out from the SLC region 31 in the memory cell array 23. The data read out is transferred via the bit line controller 22 to the data I/O buffer 16. The data transferred to the data I/O buffer 16 is transferred via the read buffer 24 and the likelihood value calculator 25 to the ECC circuit 13. In the ECC circuit 13, the error correction circuit 28 executes error correction to the data transferred. Thereafter, the data is transferred via the switch 14 to the frame converter 15.

The frame converter 15 divides one piece of frame data (ECC frame) containing certain data bits and parity data into three pieces of subframe data. In this case, the number of bits in the ECC frame is a multiple of three.

Specifically, as described above in FIG. 3, the ECC frame 103 as frame data containing the original data bits or data 101 and the parity data 102 is divided uniformly at the frame converter 15 into three pieces of subframe data such as the ECC subframe 104, the ECC subframe 105, and the ECC subframe 106. Therefore, the ECC frame 103 includes two pieces of subframe data (the ECC subframe 104, and the ECC subframe 105) including data bits only, and one piece of subframe data (the ECC frame 106) including the parity data and part of the data bits that could not be contained in the preceding two pieces of subframe data.

Figure 9:
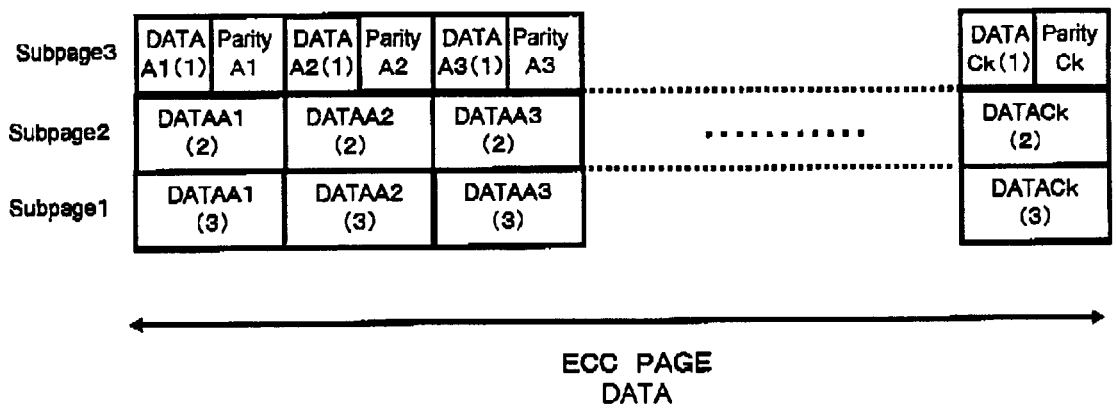
FIG. 9 is a configuration diagram of ECC page data in the first embodiment.

The pieces of subframe data thus divided are arranged in a page configuration in the MLC region 32 as shown in FIG. 9. The ECC page data in the present embodiment includes three sub-pages each composed of k ECC frames. This is because the multi-level memory in the MLC region 32 can store three bits in one memory cell and accordingly the bits in the multi-level memory can configure respective sub-pages. Specifically, as shown in FIG. 9, each k pieces of frame data A, k pieces of frame data B, and k pieces of frame data C are integrated to form the ECC page data in the MLC region 32. Therefore, the ECC page data includes frame data A1-Ak, frame data B1-Bk, and frame data C1-Ck.

The pieces of subframe data divided as shown in FIG. 3 are arranged in the multi-level memory cell in such a manner that all data in one memory cell can be occupied by the same frame data as shown in FIG. 9. For example, the subframe data including data A1(3) obtained by dividing the frame data A1 into three is arranged on the page 1 with the smallest bit inversion frequency in the multi-level memory cell. The subframe data including data A1(2) is arranged on the sub-page 2 with the second smallest bit inversion frequency. The subframe data including data A1(1) and parity A1 is arranged on the sub-page 3 with the largest bit inversion frequency. The arrangement of the subframe data including parity data on the sub-page with the largest bit inversion frequency is intended to suppress the occurrence of errors as low as possible in the original data or data bits. Namely, the arrangement of the subframe data including parity data on the sub-page with the largest bit inversion frequency is intended to suppress errors occurring in the original data bits as low as possible.

Thereafter, the frame data B1 is further divided at the frame converter 15 into three to form subframe data including data B1(1), subframe data including data B1(2), and subframe data including data B1(3) and parity B1. In addition, the frame data C1 is divided into three to form subframe data including data C1(1), subframe data including data C1(2), and subframe data including data C1(3) and parity C1.

The pieces of subframe data thus divided are stored in the multi-level memory cell as shown in FIG. 9. Namely, in a memory cell group next to the memory cell group storing the frame data A1, the pieces of subframe data including data B1(3), subframe data including data B1(2), and subframe data including data B1(1) and parity B1 are stored in respective subframes by multi-level storage. In a memory cell group next to the memory cell group storing the frame data B1, the pieces of subframe data including data C1(3), subframe data including data C1(2), and subframe data including data C1(1) and parity C1 are stored in respective subframes by multi-level storage. Finally, the pieces of subframe data including data Ck(3), subframe data including data Ck(2), and subframe data including data Ck(1) and parity Ck, are then stored in respective subframes by multi-level storage to complete one ECC page data storage.

Thus, the queued arrangement of the pieces of subframe data obtained by dividing the frame data can average the probabilities of errors occurring in the original frame data even if the error rate varies from subframe to subframe.

Figure 10:
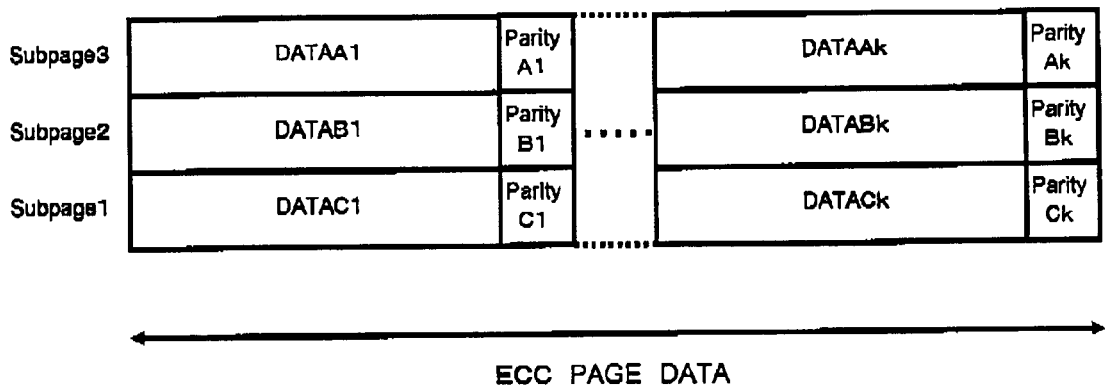
FIG. 10 is a configuration diagram of ECC page data illustrative of the first embodiment.

On the other hand, if the frame data or ECC frame is arranged in the MLC region 32 without dividing it into pieces of subframe data, an ECC frame is usually arranged on each of sub-pages configured by a multi-level memory cell as shown in FIG. 10. Each of these sub-pages includes values of three bits stored in the multi-level memory cell. Accordingly, as described in FIG. 1, the probability of error differs among the sub-page 1, the sub-page 2, and the sub-page 3.

Specifically, as shown in FIG. 10, subframe data including data C1 and parity data C1 is arranged on the sub-page 1. In addition, subframe data including data B1 and parity data B1 is arranged on the sub-page 2, and subframe data including data A1 and parity data A1 is arranged on the sub-page 3. In this case, the number of inversions in the multi-level memory cell varies from sub-page to sub-page and accordingly errors occur unevenly. Namely, the number of inversions in the multi-level memory cell varies from bit to bit, and accordingly each sub-page corresponding to each bit has a different probability of error. Therefore, if the sub-page 3 has a higher probability of error and the sub-page 1 has a lower probability of error, the data arranged on the sub-page 1 hardly introduces an error while the data arranged on the sub-page 3 easily introduces an error. A resolution for this problem requires a method of determining the number of bits in parity data relative to the sub-page 3 (while increasing parity data as a whole), or a method of executing different error corrections per a sub-page.

In the present embodiment, however, the probability of error in each frame data can be evened without increasing parity data or without providing sub-pages with different error correction circuits even if the probability of error varies from sub-page to sub-page in the multi-level memory cell.

Thus, the data formed at the frame converter 15 and to be written in the MLC region 32 is transferred via the data I/O buffer 16 to the bit line controller 22. Thereafter, it is stored in the MLC region 32 in the memory cell array 23 under the control of the word line controller 20 and the bit line controller 22.

In the present embodiment, two types of non-volatile memories are used (the MLC region 32, and the SLC region 31). It is also possible to additionally use a fast and reliable non-volatile memory such as a FeRAM (ferroelectric memory) and a MRAM (magnetoresistive memory) instead of the SLC region 31.

[Method of Reading]

Data read is activated when the I/O terminal 11 receives a read sequence. The read sequence received at the I/O terminal 11 is transferred to the control circuit 12. The control circuit 12 generates a read command and a read address from the read sequence and transfers the read command to the command I/O buffer 17 and the read address to the address buffer 18. Under the control of the word line controller 20, the bit line controller 22, the command I/O buffer 17 and the address buffer 18, data is read out of a memory cell in the memory cell array at an address indicated by the read address 23, and is transferred to the bit line controller 22. The read data transferred to the bit line controller 22 is further transferred via the data I/O buffer 16 to the read buffer 24. The threshold level-based data transferred to and accumulated in the read buffer 24 is transferred to the likelihood value calculator 25 per memory cell to calculate a likelihood value of each sub-page. Thereafter, likelihood values corresponding to the ECC frame are transferred to the ECC circuit 13 in order and subjected to certain error corrections at the error correction circuit 28. Thereafter, they are transferred to the control circuit 12 and provided to external through the I/O terminal 11.

The likelihood value calculator 25 calculates a likelihood value in each sub-page per memory cell. In the present embodiment, the ECC frame is divided into three ECC subframes, and divided ECC subframes are arranged on respective sub-pages configured by the same memory cell. Therefore, it is possible to reduce the number of memory cells in which the ECC frame is written. Thus, the likelihood value calculator 25 can efficiently execute the likelihood value calculations for the ECC frame.

The ECC algorithm in the ECC circuit 13 is described next. If the irregular LDPC code is used as the ECC algorithm in the present embodiment, a bit corresponding to a row with a higher row weight is preferably arranged on a sub-page with a lower error rate. In contrast, a bit corresponding to a row with a lower row weight is arranged on a sub-page with a higher error rate.

Figure 11:
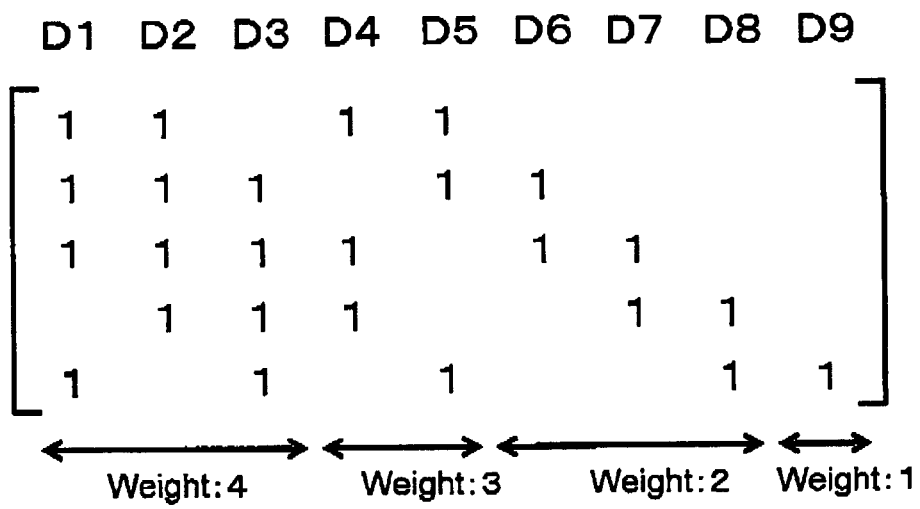
FIG. 11 is an illustrative view of an irregular LDPC code.

FIG. 11 shows a check matrix in the irregular LDPC code. The number of "1" in the matrix denotes a weight. A LDPC code defined by a check matrix of bits with uneven weights like the check matrix shown in FIG. 11 is referred to as an irregular LDPC code. The number of columns (vertical lines) corresponds to the number of parity bits and the number of rows (lateral lines) in the check matrix corresponds to the number of ECC frame bits. The ECC frame defined by the check matrix shown in FIG. 11 has a length of nine bits, which include five parity bits in this case.

In the present embodiment, the weight of the check matrix in the irregular LDPC code monotonously increases or decreases from one end of a row in the check matrix. Therefore, in the check matrix, bits D1, D2, D3 have a row weight of four, bits D4, D5 have a row weight of three, bits D6, D7, D8 have a row weight of two, and a bit D9 has a row weight of one.

Four bits of data bits are arrayed on larger weight bits D1, D2, D3, D4 and five bits of parity data are arrayed on lower weight bits D5, D6, D7, D8, D9.

The irregular LDPC code tends to commit false correction when there arises an error in lower weight bits. Accordingly, a reduction of error in bits with lower weights can suppress such false correction. Namely, the arrangement of parity bits on the sub-page with a smaller number of bit inversions as described in FIG. 1 can ensure ECC frames.

Specifically, an ECC frame with nine bits defined by a check matrix is subjected to MLC write and arranged in the MLC page data shown in FIG. 11. In this case, bits D1, D2, D3 are arranged on the sub-page 3 with the highest error rate, bits D4, D5, D6 are arranged on the sub-page 2 with a the second highest lower error rate, and bits D7, D8, D9 are arranged on the sub-page 1 with the lowest error rate. Thus, the ECC frame can be given an enhanced correction ability to reduce errors in data read out of memory cells. In the above-described case, the data of data bits includes four bits and the parity data includes five bits. In this case, however, the parity bits can not be accommodated in one sub-page and accordingly part of the parity bits is arranged on a sub-page with the second lowest error rate. Namely, if it is required to store the parity data over a plurality of sub-pages, it is stored in sub-pages in increasing order of the number of bit inversions, beginning from the sub-page with the smallest number of bit inversions (variations in bit).

Second Embodiment

A second embodiment has a different arrangement, in the ECC page data, of subframe data formed at the frame converter 15.

Figure 12:
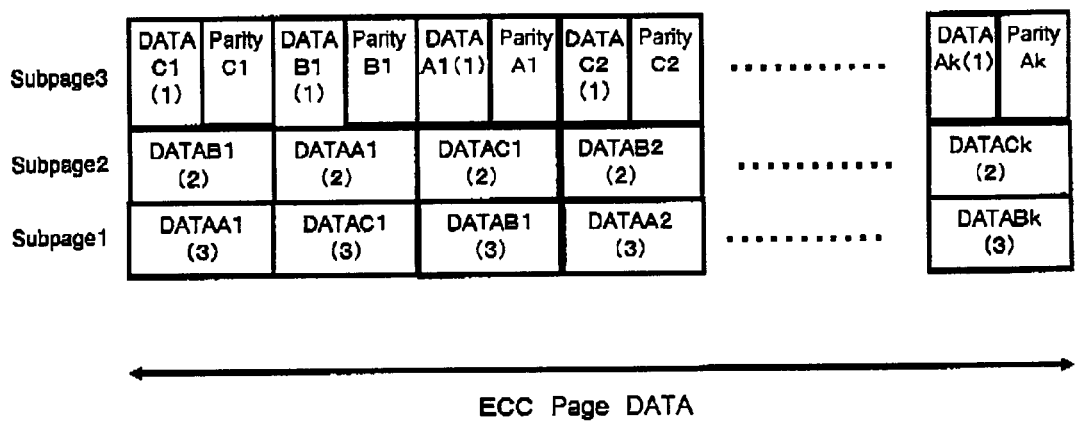
FIG. 12 is a configuration diagram of ECC page data in a second embodiment.

Specifically, the pieces of subframe data divided are arranged in pages in the MLC region 32 as shown in FIG. 12. The ECC page data in the present embodiment includes three sub-pages each composed of k ECC frames. This is because the multi-level memory in the MLC region 32 can store three bits in one memory cell and accordingly the bits in the multi-level memory can configure respective sub-pages. Specifically, as shown in FIG. 12, k pieces of frame data A, k pieces of frame data B, and k pieces of frame data C as ECC frames are integrated to form the ECC page data in the MLC region 32. Therefore, the ECC page data includes frame data A1-Ak, frame data B1-Bk, and frame data C1-Ck.

The frame data A1 is divided into three to form subframe data including data A1(1), subframe data including data A1(2), and subframe data including data A1(3) and parity A1. The frame data B1 is divided into three to form subframe data including data B1(1), subframe data including data B1(2), and subframe data including data B1(3) and parity B1. The frame data C1 is divided into three to form subframe data including data C1(1), subframe data including data C1(2), and subframe data including data C1(3) and parity C1. Similarly, other frame data is divided into three to form pieces of subframe data.

The pieces of subframe data thus divided are arranged such that different pieces of frame data are stored in one multi-level memory cell as shown in FIG. 12. Namely, in a first memory cell group, the pieces of subframe data including data A1(3), subframe data including data B1(2), and subframe data including data C1(1) and parity C1 are stored in respective subframes by multi-level storage. In the next memory cell group, the pieces of subframe data including data C1(3), subframe data including data A1(2), and subframe data including data B1(1) and parity B1 are stored in respective subframes by multi-level storage. In the next memory cell group but one, the pieces of subframe data including data B1(3), subframe data including data C1(2), and subframe data including data A1(1) and parity A1 are stored in respective subframes by multi-level storage. Finally, through such sequential arrangements, the pieces of subframe data including data Bk(3), subframe data including data Ck(2), and subframe data including data Ak(1) and parity Ak are stored in respective subframes by multi-level storage to complete one ECC page data storage.

Similar to the first embodiment, the sub-page 1 includes bits with the smallest number of bit inversions in multi-level storage in the memory cell, the sub-page 2 includes bits with the second smallest number, and the sub-page 3 includes bits with the largest number. Therefore, the parity data can be stored all in the sub-page 3 like in the first embodiment.

Such the arrangement of ECC page data allows all bits within the same frame data to be stored in different memory cells. Therefore, the data can be easily restored through error correction even if one memory cell is broken as a whole.

Third Embodiment

A third embodiment has a different arrangement, in the ECC page data, of sub-frame data formed at the frame converter 15.

Figure 13:
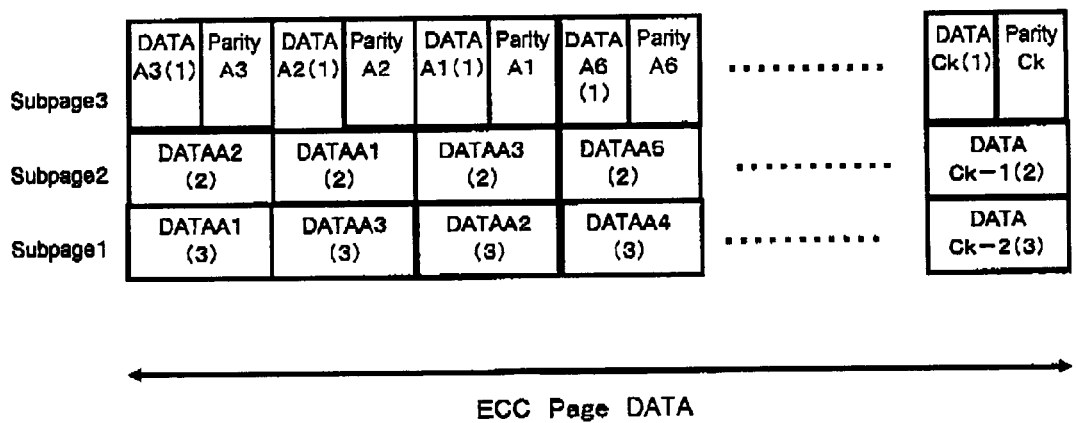
FIG. 13 is a configuration diagram of ECC page data in a third embodiment.

Specifically, the pieces of subframe data divided are arranged in pages in the MLC region 32 as shown in FIG. 13. The ECC page data in the present embodiment includes three sub-pages each composed of k ECC frames. This is because the multi-level memory in the MLC region 32 can store three bits in one memory cell and accordingly the bits in the multi-level memory can configure respective sub-pages. Specifically, as shown in FIG. 13, k pieces of frame data A, k pieces of frame data B, and k pieces of frame data C as ECC frames are integrated to form the ECC page data in the MLC region 32. Therefore, the ECC page data includes frame data A1-Ak, frame data B1-Bk, and frame data C1-Ck.

The frame data A1, A2, A3 or the like is divided into three to form pieces of subframe data in the same manner as in the second embodiment.

The pieces of subframe data thus divided are arranged such that different pieces of frame data are stored in one multi-level memory cell as shown in FIG. 13. Namely, in a first memory cell group, the pieces of subframe data including data A1(3), subframe data including data A2(2), and subframe data including data A3(1) and parity A3 are stored in respective subframes by multi-level storage. In the next memory cell group, the pieces of subframe data including data A3(3), subframe data including data A1(2), and subframe data including data A2(1) and parity A2 are stored in respective subframes by multi-level storage. In the next memory cell group but one, the pieces of subframe data including data A2(3), subframe data including data A3(2), and subframe data including data A1(1) and parity A1 are stored in respective subframes by multi-level storage. Finally, through such sequential arrangements, the pieces of subframe data including data Ck-2(3), subframe data including data Ck-1(2), and subframe data including data Ck(1) and parity Ck are stored in respective subframes by multi-level storage to complete one ECC page data storage.

Similar to the first embodiment, the sub-page 1 includes bits with the smallest number of bit inversions in multi-level storage in the memory cell, the sub-page 2 includes bits with the second smallest number, and the sub-page 3 includes bits with the largest number. Therefore, the parity data can be stored all in the sub-page 3 like in the first embodiment.

Also in the present embodiment, similar to the second embodiment, such the arrangement of ECC page data allows all bits within the same frame data to be stored in different memory cells. Therefore, the data can be easily restored through error correction even if one memory cell is broken as a whole.

Fourth Embodiment

Figure 14:
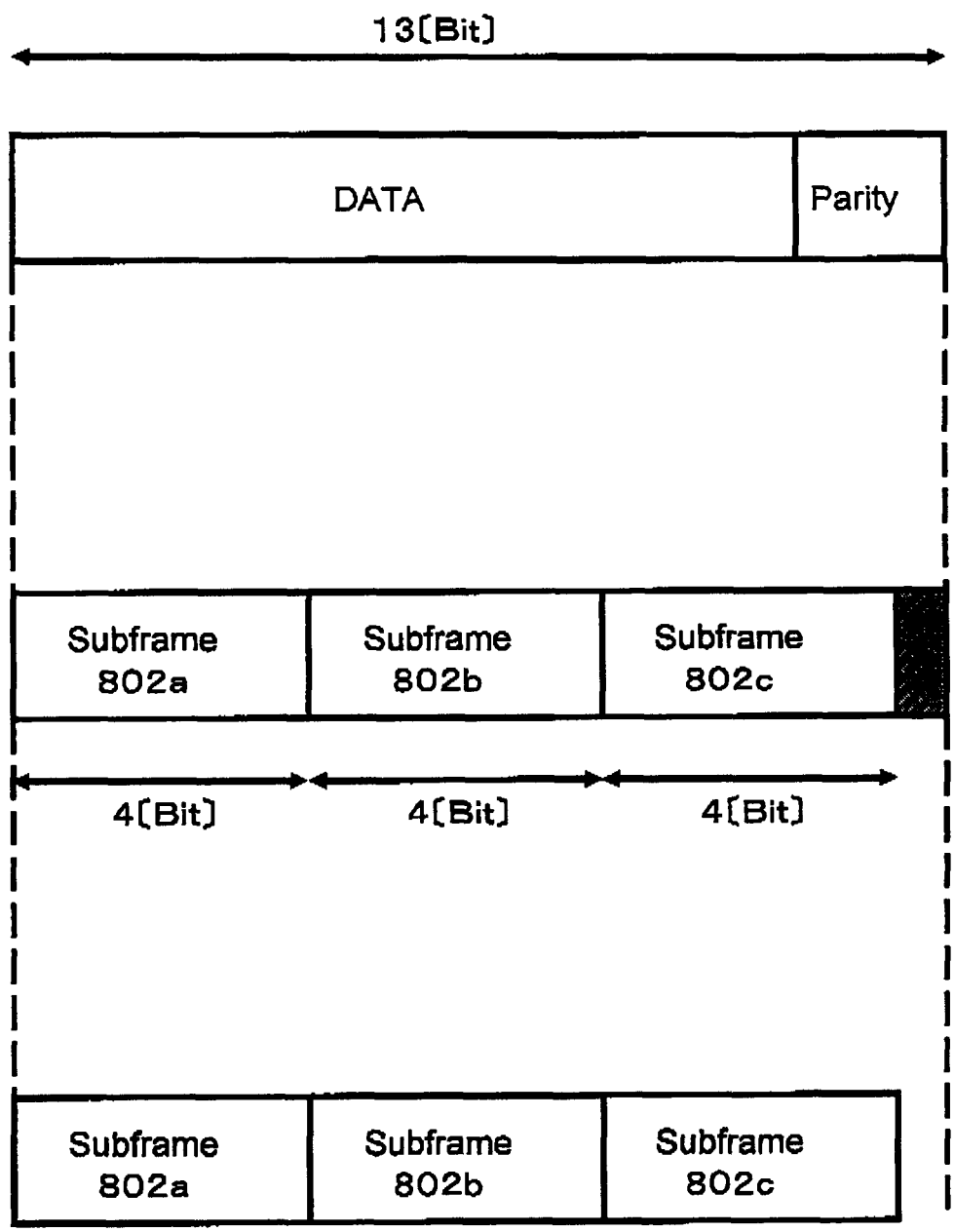
FIG. 14 is an illustrative view of frame conversion in a fourth embodiment.

A fourth embodiment is directed to a case where the number of bits in an ECC frame containing data bits and parity data is not a multiple of the number of multi-level bits in a memory cell for multi-level storage. Namely, in a memory cell for multi-level storage of N bits, the number of bits in the ECC frame is not a multiple of N. Specifically, three bits are stored in one memory cell as multi-level storage as shown in FIG. 14 and the number of bits in the ECC frame is equal to 13. In this case, the frame converter 15 divides the number of bits in the ECC frame or 13 by the number of multi-level bits or three and processes the remainder bit as the eliminated bit. Specifically, part of the parity data in the ECC frame is eliminated to form pieces of subframe data of four bits or subframes 802a, 802b, 802c to be stored in a memory cell. As a result, multi-level storage can be executed with higher memory cell efficiency.

Fifth Embodiment

Figure 15:
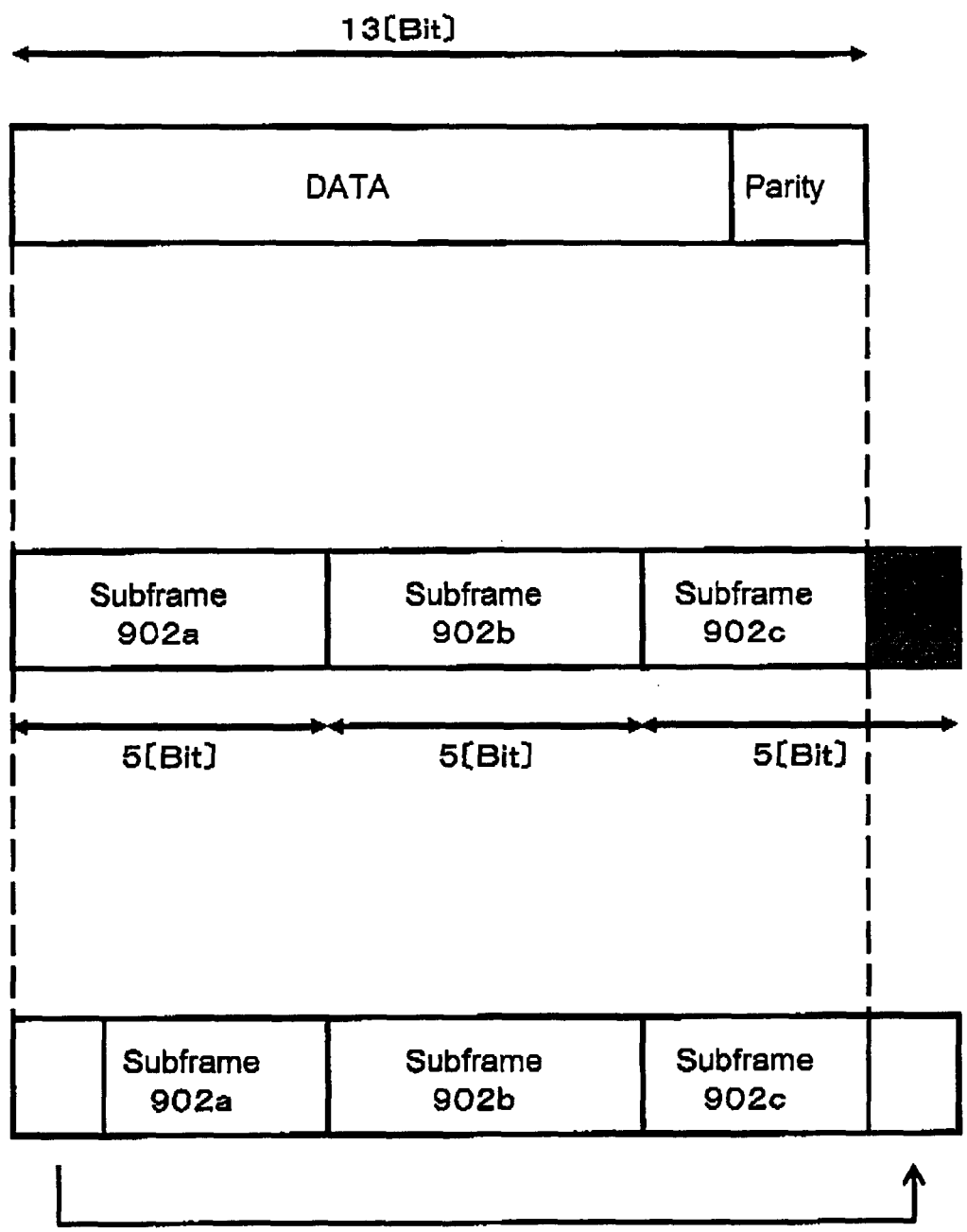
FIG. 15 is an illustrative view of frame conversion in a fifth embodiment.

A fifth embodiment is directed to the case similar to the fourth embodiment where the number of bits in the ECC frame is not a multiple of the number of multi-level bits in a memory cell for multi-level storage. Namely, the number of bits in the ECC frame is not a multiple of N in a memory cell for multi-level storage of N bits. Specifically, three bits are stored in one memory cell as multi-level storage as shown in FIG. 15 and the number of bits in the ECC frame is equal to 13. In this case, the number of bits in the ECC frame or 13 is divided by the number of multi-level bits or three and the remainder is rounded up by adding part of the data bits to the ECC frame to make it equal to the number of bits in a subframe.

In this way, the frame converter 15 forms pieces of subframe data of five bits or subframes 902a, 902b, 902c to be stored in a memory cell. In this case, the storage region has an excess of two bits, which can be used to store part of data of the original bits. Namely, part of data in the subframe 902a is stored in the region 902c. This is effective to further improve the relief rate through error correction.

Sixth Embodiment

Figure 16:
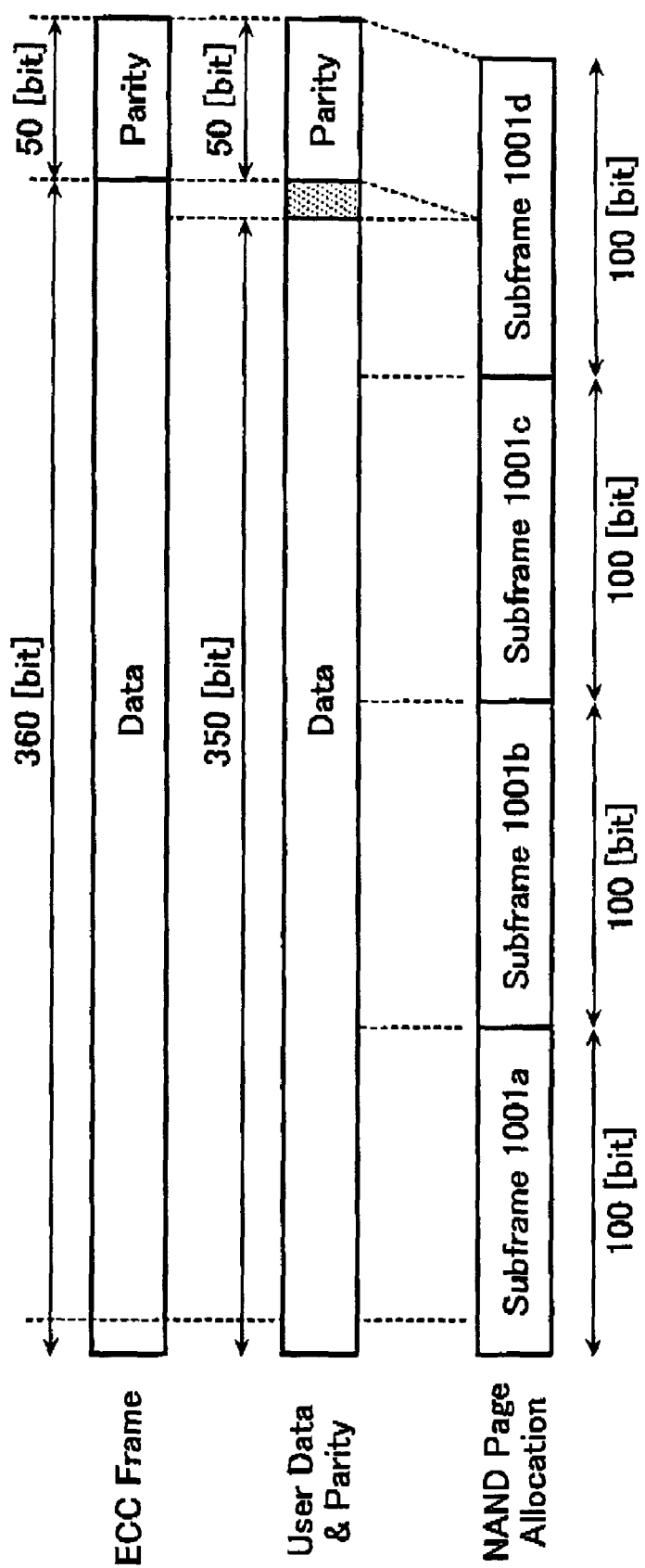
FIG. 16 is a illustrative view of a ECC frame in a sixth embodiment.

A sixth embodiment is directed to the case where user-data length and data-bit length in the ECC frame do not match. Specifically, assume that the data-bit length in the ECC frame is 360 bits, while the user-data length is 350 bits, as shown in FIG. 16. In this case, 10 bits of "0" data is added to the end of the user data at the ECC circuit 13 when a parity-bit calculation is conducted to make 360-bit user data.

When data is written in the memory cells, although the added 10-bit "0" data is not written therein. Instead, the frame converter 15 adds 50-bit parity data to the original 350-bit user data, and conducts a subframe conversion to the 400-bit data after the addition. Note that the decoding of the LDPC code at the time of reading is done after 10 bit data corresponding to the "0" data is converted into "0" data in advance. This enables user data with shorter data length than the data-bit length of the ECC frame to be encoded or decoded using a LDPC code.

The present invention is not limited to the above embodiments but rather can be embodied by modifying the components in practical stages without departing from the scope and spirit of the invention. The components disclosed in the above embodiments can be combined appropriately to form various inventions. For example, some components may be omitted from all the components shown in the above embodiments. Further, the components used among different embodiments may be combined appropriately.

What is claimed is:

1. A non-volatile semiconductor memory device, comprising:
    a memory cell array including a plurality of memory cells arrayed therein, the memory cells being capable of storing information of N bits (N≧2) in accordance with variations in threshold voltage;
    a parity data adder circuit configured to add parity data for error correction to every certain data bits to be stored in the memory cell array;
    a frame converter circuit configured to uniformly divide frame data containing the data bits and the parity data into N pieces of subframe data; and
    a programming circuit configured to store the subframe data divided into N pieces in respective N sub-pages formed corresponding to the information of N bits,
    wherein the parity data is stored in the N sub-pages in order beginning from a sub-page with the smallest variation in bits between adjacent threshold voltage states.

2. The non-volatile semiconductor memory device according to claim 1, wherein the number of bits in the frame data is a multiple of N.

3. The non-volatile semiconductor memory device according to claim 1, wherein when the number of bits in the frame data is not a multiple of N, part of the parity data in the frame data is eliminated to make the number of bits in the frame data equal to a multiple of N.

4. The non-volatile semiconductor memory device according to claim 1, wherein when the number of bits in the frame data is not a multiple of N, part of the data bits in the frame data is added to the frame data to make the number of bits in the frame data equal to a multiple of N.

5. A non-volatile semiconductor memory device, comprising:
    a parity data adder circuit configured to add parity data for error correction to every certain data bits to be stored in a memory cell array, the memory cell array including a plurality of memory cells arrayed therein, the memory cells being capable of storing information of N bits (N≧2) in accordance with variations in threshold voltage;
    a frame converter circuit configured to uniformly divide frame data containing the data bits and the parity data into N pieces of subframe data; and a programming circuit configured to store the subframe data divided into N pieces in respective N sub-pages formed corresponding to the information of N bits, wherein the parity data is stored in the N sub-pages in order beginning from a sub-page with the smallest variation in bits between adjacent threshold voltage states.

6. The non-volatile semiconductor memory device according to claim 5, wherein the number of bits in the frame data is a multiple of N.

7. The non-volatile semiconductor memory device according to claim 5, wherein when the number of bits in the frame data is not a multiple of N, part of the parity data in the frame data is eliminated to make the number of bits in the frame data equal to a multiple of N.

8. The non-volatile semiconductor memory device according to claim 5, wherein when the number of bits in the frame data is not a multiple of N, part of the data bits in the frame data is added to the frame data to make the number of bits in the frame data equal to a multiple of N.

9. The non-volatile semiconductor memory device according to claim 5, wherein when the number of bits in the data bits is more than that of user data to be stored, "0" data is added to the end of the user data, the number of bits in the "0" data added being equal to the difference between the number of bits in the data bits and that of the user data, and when the user data is stored in the memory cell, ECC frame data including user data except the "0" data added and the parity data is stored in the memory cell.

10. The non-volatile semiconductor memory device according to claim 5, wherein when the ECC frame data is decoded, the ECC frame data is decoded after the data corresponding to the "0" data added is converted into "0" data.

* * * * *